US010635001B2

(12) United States Patent
Tan et al.

(10) Patent No.: US 10,635,001 B2
(45) Date of Patent: Apr. 28, 2020

(54) PATTERNED BANK STRUCTURES ON SUBSTRATES AND FORMATION METHOD

(71) Applicant: Merck Patent GmbH, Darmstadt (DE)

(72) Inventors: Li Wei Tan, Eastleigh (GB); Pawel Miskiewicz, Southampton (GB); Graham Smith, Southampton (GB)

(73) Assignee: Merck Patent GmbH (DE)

( * ) Notice: Subject to any disclaimer, the term of this patent is extended or adjusted under 35 U.S.C. 154(b) by 14 days.

(21) Appl. No.: 15/753,837

(22) PCT Filed: Jul. 25, 2016

(86) PCT No.: PCT/EP2016/001290
§ 371 (c)(1),
(2) Date: Feb. 20, 2018

(87) PCT Pub. No.: WO2017/032437
PCT Pub. Date: Mar. 2, 2017

(65) Prior Publication Data
US 2019/0011834 A1 Jan. 10, 2019

(30) Foreign Application Priority Data

Aug. 21, 2015 (EP) ..................................... 15002485

(51) Int. Cl.
G03F 7/38 (2006.01)
G03F 7/40 (2006.01)
H01L 31/04 (2014.01)
G03F 7/022 (2006.01)
G03F 7/004 (2006.01)
G03F 7/023 (2006.01)
G03F 7/035 (2006.01)
G03F 7/038 (2006.01)
G03F 7/00 (2006.01)
H01L 21/3205 (2006.01)
H01L 51/50 (2006.01)

(52) U.S. Cl.
CPC .............. *G03F 7/40* (2013.01); *G03F 7/0048* (2013.01); *G03F 7/022* (2013.01); *G03F 7/0226* (2013.01); *G03F 7/0236* (2013.01); *G03F 7/035* (2013.01); *G03F 7/0381* (2013.01); *G03F 7/38* (2013.01); *G03F 7/0007* (2013.01); *H01L 21/3205* (2013.01); *H01L 31/04* (2013.01); *H01L 51/5012* (2013.01)

(58) Field of Classification Search
CPC . G03F 7/0007; G03F 7/38; G03F 7/40; G03F 7/0226; G03F 7/0236; H01L 21/3205; H01L 51/5012
USPC ................................ 430/191, 192, 193, 326
See application file for complete search history.

(56) References Cited

U.S. PATENT DOCUMENTS 5,110,706 A * 5/1992 Yumoto ................ G03F 7/0226
430/165
5,368,975 A 11/1994 Elsaessser et al.
7,399,576 B1 * 7/2008 Levanon ............... B41C 1/1008
430/170

FOREIGN PATENT DOCUMENTS

EP 0843218 A1 5/1998
WO WO-2004088424 A2 10/2004
WO WO-2006083104 A1 8/2006

OTHER PUBLICATIONS

International Search Report for PCT/EP2016/001290 dated Dec. 5, 2016.
Written Opinion of the International Searching Authority for PCT/EP2016/001290 dated Dec. 5, 2016.

* cited by examiner

Primary Examiner — John S Chu
(74) Attorney, Agent, or Firm — Faegre Drinker Biddle & Reath LLP

(57) ABSTRACT

A photolithiographic method for fabricating bank structures with improved non-wetting properties to form well regions on a substrate using a photoresist composition comprising a cresol novolak resin, a photoactive diazonaphthoquinone sulfonic ester of a polyhydroxybenzophenone compound with at least one free hydroxyl group, and a non-ionic urethane polyglycol fluorosurfactant. Inkjet methods can be used to deposit active materials into the well areas. Color filter arrays and optoelectronic devices such as OLED devices can be made by this method.

33 Claims, 7 Drawing Sheets

PATTERNED BANK STRUCTURES ON SUBSTRATES AND FORMATION METHOD

CROSS-REFERENCE TO RELATED APPLICATIONS

This application is a national stage application (under 35 U.S.C. § 371) of PCT/EP2016/001290, filed Jul. 25, 2016, which claims benefit of European Application No. 15002485.9, filed Aug. 21, 2015, both of which are incorporated herein by reference in their entirety.

Embodiments in accordance with the present invention relate generally to the use of particular photoresist formulations to create a structure on a substrate, and more specifically for the creation of separators, insulating structures or bank structures on such substrates and to organic electronic devices or color filter arrays comprising such structures and to processes and methods for preparing such structures and to organic electronic devices or color filter arrays encompassing such structures. The photoresist formulation contains a cresol novolak resin, a photoactive diazonaphthoquinone sulfonic ester of a polyhydroxybenzophenone compound with at least one free hydroxyl group, and a non-ionic urethane polyglycol fluorosurfactant in a solvent.

BACKGROUND

It would desirable for cost and manufacturability to prepare organic electronic devices such as organic electronic (OE) devices, such as organic field effect transistors (OFETs) or organic light emitting diodes (OLEDs), organic photovoltaics (OPVs) or color filter arrays used in such devices, by deposition of thin film materials (either active or passive materials) in solution on a specific area. Commonly used techniques such as shadow masking using high temperature vacuum deposition are expensive, wasteful of materials and require complicated machinery. One potential solution would be to provide a substrate comprising a patterned bank layer that defines wells into which the active components can be deposited in solution or in liquid form. The wells contain the solution such that the active components remain in the areas of the substrate defined by the wells. The solutions can be introduced into the wells using ink-jet as well as other techniques.

Bank structures, and methods of forming them, are known to be used for defining such confined places (wells) on a substrate. For example, US 2007/0023837 A1, WO 2008/117395 A1, EP 1933393 A1, GB 2,458,454 A, GB 2,462,845 A, US 2003/017360 A1, US 2007/190673 A1, WO 2007/023272 A1 and WO 2009/077738 A1 individually and collectively are representative disclosures of such known structures and methods.

Even if a patterned layer of well-defining bank material is provided, problems still exist in containing the solution within the well region and providing good film formation in the well region using solution processing techniques. Uncontrollable wetting of the well-defining bank layer may occur since the contact angle of the solution on the well-defining bank layer is typically low. In the worst case, the solution may overspill the wells. It is also important that the organic material within the well be as uniformly spread as possible over the entire surface of the bottom of the well. This means that the substrate that forms the bottom of the well and which contacts the organic material should have a low contact angle (high wetting) with organic solutions (see FIG. 1d). However, the contact angle on the substrate cannot be too low for the organic layer as this will lead to the layer having an increased degree of non-uniform thickness, particularly when the well area is very small (see FIG. 1e and FIG. 1f). The combination of bank structures having a high contact angle and a substrate surface having a low contact angle allows for uniform spread of the organic solution within the well, particularly in the edge areas where the substrate and the bank structures meet.

However, the photoresist processes that can be used to create bank structures can affect the wetting properties of the substrate, which is −25 initially covered by the photoresist composition and later removed during processing. A high contact angle for the bank structure is also a very important property for increasing the process window of the printing formulation on the substrate. This is because during the deposition of a solution into the well, the maximum volume that can be deposited and retained in the well could be much larger (2 to 6 times) than the maximum volume of the well if the contact angle of bank with the printed formulation is very high (FIGS. 1a to 1c). This increase in the amount of liquid formulation that can be contained in the well allows for a greater layer thickness that can be achieved. This is particularly important during the preparation of a high resolution device where it is desirable to decrease the pixel size or active area but the thickness requirement for the active layer remains the same or sometimes even higher.

The use of fluorine containing materials in or on such banks in order to modify their wetting properties is well-known. For example, Moon et al, IEEE Electron Device Let., 32(8), 1137 (2011), U.S. Pat. No. 8,765,224, GB 2462845, EP 1905800, WO 03/083960, US 2014/0147950, U.S. Pat. Nos. 7,781,963, 8,217,573, EP 2391187, JP 2008096717, WO 2014/069478 and US 2007/0020899 are individually and collectively representative disclosures of such known structures and methods.

The use of a cresol based novolak (also spelled as novolac) resin is well known as a component for a photoresist. For example, see the section titled "DNQ-Novolac photoresist" in http://en.wikipedia.org/wiki/photoresist. The use of a diazonaphthoquinone (DNQ) photoactive compound (PAC) in such novalak based photoresists is also well known. For example, see http://en.wikipedia.org/wiki/Diazonaphthoquinone. Further information can also be found in Phenolic Resins: Chemistry, Applications, Standardization, Safety and Ecology; A. Gardziella, L. A. Pilato, A. Knop; Springer Science & Business Media, 2000 as well as Diazonaphthoquinone-based Resists; R. Dammel; SPIE Press, 1993. It is also known that one useful class of DNQs are those based on diazonaphthoquinone sulfonate esters of polyhydroxybenzophenones (for example, see U.S. Pat. No. 3,130,048 and JP 9-031044).

U.S. Pat. Nos. 4,587,196, 4,719,167, 4,863,828, 4,906,549, 4,943,511, 5,153,096, 5,478,692 and 5,395,728 describe photoresists using a cresol based novolak resin with 2-diazonaphthoquinone-(4- or 5-) sulfonate esters of various polyhydroxybenzophenones which may optionally contain a surfactant.

US 2012/0287393 describes photoresists using a cresol based novolak resin with 2-diazonaphthoquinone-(4- or 5-) sulfonate esters of various polyhydroxybenzophenones which may optionally contain a fluorosurfactant (among others).

U.S. Pat. No. 6,911,293 describes photoresists using cresol based novolak resins with 2-diazonaphthoquinone-(4- or 5-) sulfonate esters of various polyhydroxybenzophenones with a proprietary fluorosurfactant MEGAFAC R-08 (Dainippon Ink) of undisclosed structure.

JP 08-015858 describes printing plates prepared using photoresists with cresol based novolak resins (among others) with fluorosurfactants such as fluorinated urethanes and 2-diazonaphthoquinone sulfonic acid or polymeric esters thereof. U.S. Pat. No. 4,822,713 and GB 2023858 describe printing plates prepared using photoresists using cresol based novolak resins (among others) with fluorosurfactants such as fluorinated (meth)acrylates and 2-naphthoquinone sulfonic acids or polymeric esters thereof.

U.S. Pat. No. 8,883,402 describes a phototool (a photographic mask or stencil bearing a circuit pattern on a transparent substrate) which includes a fluorinated polyurethane as a release agent. The phototool can be prepared using cresol based novolak resins (among others) with 2-diazonaphthoquinone-(4- or 5-) sulfonate esters of various polyhydroxybenzophenones (among others).

U.S. Pat. Nos. 5,858,547 and 6,517,951 describe the use of cresol based novolak resins with fluorosurfactants (among others) as a planarization layer. Such formulations are thermally set and do not contain a PAC.

U.S. Pat. No. 7,749,676 describes photoresists using cresol based novolak resins with 2-diazonaphthoquinone-(4- or 5-) sulfonate esters of various polyhydroxybenzophenones with a fluorinated silicon resin of high viscosity as a releasing agent.

U.S. Pat. Nos. 7,338,737 and 7,297,452 describe photoresists using alkali-soluble resin (desirably a copolymer that derived from an unsaturated carboxylic acid) with 2-diazonaphthoquinone-(4- or 5-) sulfonate esters of various polyhydroxybenzophenones with a surfactant (desirably, epoxide based fluorosurfactants among others).

U.S. Pat. No. 5,368,975 describes a negative-working photoresist using a novolak resin (among others), a diazonaphthoquinone sulfonic ester (among others) and a non-ionic oligomeric urethane compound. The urethane compound contains a poly(ethylene oxide)$_{3-25}$ group as well as aromatic rings. Although trifluoromethyl groups are disclosed as a optional substitutent on the aromatic rings, the overall fluorine content of the entire molecule would be very low.

U.S. Pat. No. 4,613,561 describes an aqueous alkaline two-step developing method for a positive photoresist where the developer includes a fluorosurfactant.

U.S. Pat. No. 7,449,280 describes a photoresist composition which can contain a urethane fluorosurfactant (among others).

However, in spite of all of these investigations, there is still a need to provide photoresist compositions that provide well structures with the necessary wetting properties. Thus it would be desirable to provide positive or negative working photoresist compositions for use in forming bank structures that are compatible with ink-jet printing and photolithography which provide desirable solution-containing properties.

Additionally it would be desirable to provide high resolution methods of forming such bank structures using methods that are both compatible with ink-jet printing and photolithography and do not require the use of processes such as halocarbon reactive ion etching or other post-formation treatments. Still further it would be desirable to provide OE devices or color filter arrays manufactured using such desirable structure defining materials and structure forming methods. Finally, there is a need to provide small active areas with uniform film thickness in the wells between the bank structures.

SUMMARY

Embodiments in accordance with the present invention encompass a method for fabricating bank structures that define well regions on a substrate comprising in order, the steps of:

preparing a solution comprising a cresol novolak resin, a photoactive diazonaphthoquinone sulfonic ester of a polyhydroxybenzophenone compound with at least one free hydroxyl group, and a non-ionic urethane polyglycol fluorosurfactant;

coating the solution over the substrate to form a film;

heating the coated substrate to remove any solvent;

using a radiation source and a photomask to expose the coated substrate in a pattern;

developing the substrate to remove the thin film in one of the exposed or unexposed regions so that the unremoved material in the other region form banks that define well regions of uncovered substrate; and heating the developed substrate.

In some embodiments, there is an additional step of depositing at least one active material into the well area defined by the banks of unremoved photoresist and the substrate to form at least one layer(s) of active material overlying and in contact with the substrate. Desirably, an ink-jet method is used for the deposition of the active material. Other embodiments encompass substrates with bank structures derived from a photoresist formulation comprising a cresol novolak resin, a photoactive diazonaphthoquinone sulfonic ester of a polyhydroxybenzophenone compound with at least one free hydroxyl group, and a non-ionic urethane polyglycol fluorosurfactant.

Some embodiments in accordance with the present invention encompass using non-ionic urethane fluorosurfactants containing poly(ethylene or propylene glycol) groups. In other embodiments, the fluorinated parts of the surfactant are groups derived from a perfluoroalkyl group with a terminal hydroxyl or carboxyl group. Other embodiments in accordance with the present invention encompass using a 2-diazonaphtho-1-quinone substituted in either the 4- or 5-position with an sulfonic ester of a benzophenone group substituted with 2 or 3 free hydoxyl groups.

The method provides substrates with high quality well-defining bank structures with improved wetting properties. The low-wetting properties of the bank structures containing the urethane polyglycol fluorosurfactant allow for uniform formation of the active areas during filling of the wells with active material(s) while minimizing risk of spillage over the bank structures and improving the uniformity of the film formation within the active area by increasing the wetting of the substrate with the relatively low wetting insulator/bank surrounding the active area. Moreover, the methods described can be readily used to manufacture substrates at low cost with high output using the methods described.

BRIEF DESCRIPTION OF THE DRAWINGS

Embodiments of the invention are described below with reference to the following drawings. Because the size of the individual components is very small, the drawings are not to scale.

FIG. 2b is a plane view of the embodiment of FIG. 2a.

DETAILED DESCRIPTION

Figure 1A:
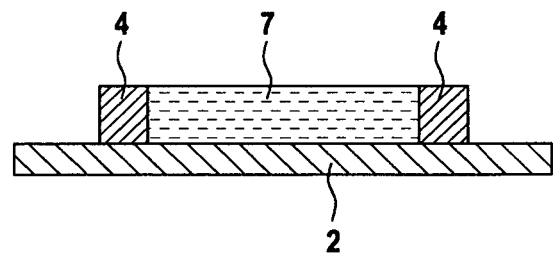
FIG. 1a is a schematic representation of the maximum volume of the well.
Figure 1B:
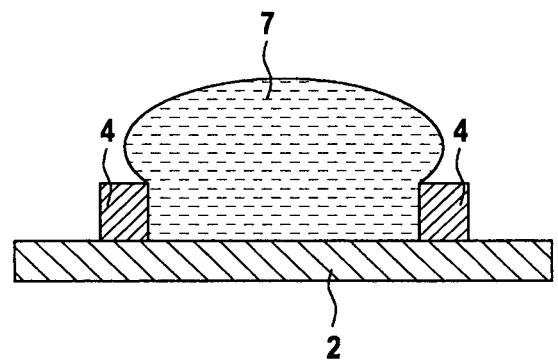
FIG. 1b illustrates that the maximum volume of the well can be greatly exceeded when the bank structures have high contact angles.
Figure 1C:
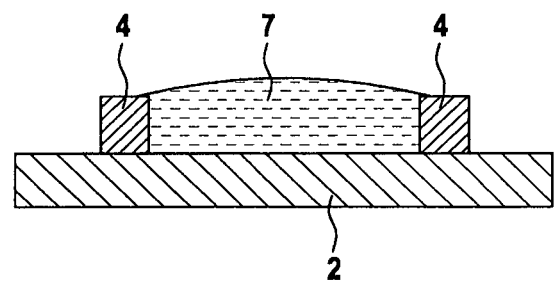
FIG. 1c illustrates the effect when the maximum volume is exceeded when the bank structures have a low contact angle.
Figure 1D:
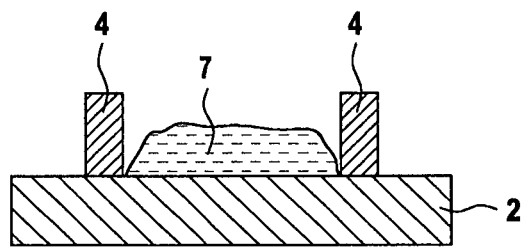
FIG. 1d illustrates the improved thickness of the active layer when there is a low contact angle of the substrate for organic materials.
Figure 1E:
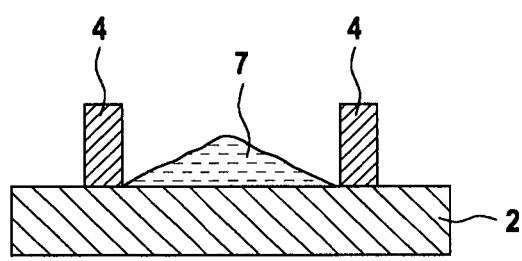
FIG. 1e illustrates one kind of non-uniformity of the active layer that can occur if the contact angle of the substrate towards organic materials is too low.
Figure 1F:
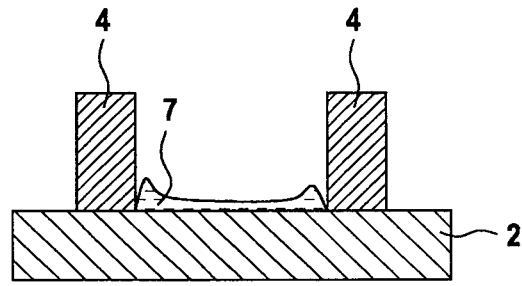
FIG. 1f illustrates another kind of non-uniformity of the active layer that can occur due to coffee staining effect during the drying of the solution deposited on low contact angle substrate with high contact angle bank wall.

In the following, all % are by weight unless noted otherwise.

Novolaks are phenol-formaldehyde resins with a formaldehyde to phenol molar ratio of less than one. Typically, the polymerization is brought to completion using acid-catalysis such as oxalic acid, hydrochloric acid or sulfonate acids. The phenol units are mainly linked by methylene and/or ether groups. The molecular weight of novolaks used for resist production are relatively small. The number average molecular weight (Mn) of resist-grade novolaks is generally between 1000 and 3000, which corresponds to between 8 and 20 repeat units, while the weight average molecular weight (Mw) may be as large as 20,000. Thus, the polydispersity of novolak resins used for resist applications can be quite large. The resins have such low molecular weights, that they are also sometimes referred to as oligomers or oligomeric mixtures. They often contain additional cross-linking reagents such as di-hydroxymethyl-phenols as well.

The method of the invention uses a photoresist composition that contains cresol based novolak resin as the primary non-volatile component. It should be understood for the purposes of the invention that a cresol novolak resin primarily (>50%) contains cresol derivatives (o-, m- and p-) as the phenolic component. Dimethylphenols, such as 2,6-dimethylphenol may also be present. As is known (for example, see U.S. Pat. No. 4,587,196), the relative amounts of each cresol can affect the overall properties. The synthesis and preparation of cresol novolak resins are well known in the art. In addition, cresol based novolak resins with a wide range of performance features are commercially available from a number of manufacturers including, for example, the AZ® and TI® lines (Microchemicals) and the Bakelite® lines (Hexion).

The concentration of the cresol novolak resin in the solution should be at least 5% and more preferably, at least 15%. In some embodiments, it is highly preferred that the amount of o-cresol resin in the solution is 30% or less. It is believed that having a lower concentration of the resin in the solution promotes the effect of the non-ionic urethane fluorosurfactant because the phase separation between the fluorosulfactant with cresol novolak resin will be more pronounced and the fluorosulfactant can move to the outer surfaces of the bank easier.

The bank structures and method of the invention uses a photoresist composition that also contains a photoactive diazonaphthoquinone sulfonic ester of a polyhydroxy-benzophenone compound where the benzophenone group has at least one hydroxyl group.

Diazonaphthoquinone (DNQ) sulfonic acid esters are commonly used as photactive components of photoresist materials for semiconductor manufacturing. When exposed to actinic radiation, they undergo a Wolff rearrangement to form a ketene, which upon hydrolysis, forms an indene carboxylic acid. In positive-working photolithiography, the DNQ is belived to function as a dissolution inhibitor (for example, see Roy et al, Magn. Reson. Chem., 41, 84-90 (2003)) and the exposed regions of the photoresist film become soluble in aqueous base and the unexposed regions insoluble. DNQ can also be used in negative-working photolithiography (see for example, U.S. Pat. No. 4,104,070) where the exposed regions become insoluble in aqueous base and the unexposed regions become soluble by using appropriate processing conditions or the use of additional components.

The diazonaphthoquinone sulfonic ester of a polyhydroxybenzophenone compound of the invention is a discrete compound (or mixture of related compounds) and is not attached to a polymeric backbone. A polyhydroxybenzophenone is a benzophenone where the number of the hydroxyl groups per one molecule of the polyhydroxybenzophenone compound is in the range of 2 to 7, and more preferably in the range of 3 to 5. There must be at least one free hydroxy group on the benzophenone group of the inventive diazonaphthoquinone compound, and more desirably, 2 or 3 free hydroxyl groups. Relative to the polyhydroxylated benzophenone, it is not critical which hydroxyl group is attached to the sulfonyl group of the diazonaphthoquinone and the material used may be a single isomer or may be a mixture of isomers where the DNQ sulfonate ester is attached to different positions of the polyhdroxy benzophenone. Moreover, there may be more than one diazonaphthoquinone attached to the polyhydroxybenzophenone so long as there at least one free hydroxy group still present on the benzophenone group. Desirably, there is only one diazonapthoquinone sulfonate moiety per one polyhydroxybenzophenone moiety. It is also desirable that the free hydroxy group is in the ortho position to the carbonyl group of the benzophenone. Compounds with a polyhydroxybenzophenone where all of the hydroxy groups are connected to a DNQ so there are no free hydroxyl groups are not part of the invention.

The DNQ of the invention is a 2-diazo-1-naphthoquinone where the sulfonic ester group is either in the 4- or 5-position according to the following formulae:

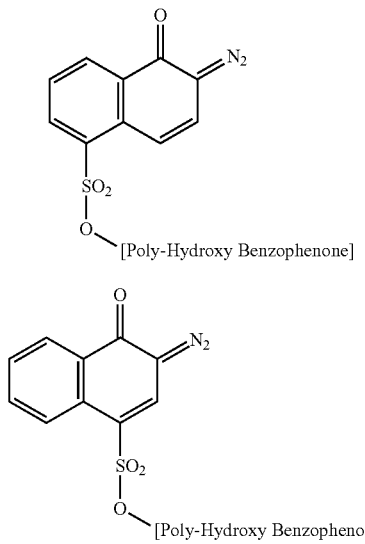

The 4-sulfonic ester of Formula (II) is preferred.

The preparation of diazonaphthoquinone sulfonic ester of a polyhydroxybenzophenone compound is well known in the art. Generally, commercially available 2-diazo-1-naphthoquinone-(4- or 5-) sulfonyl chloride is reacted with a polyhydroxybenzophenone, many of which are also commercially available, under basic conditions.

Some representative examples of polyhydroxybenzophenone compounds are:

(a) Polyhydroxybenzophenones such as 2,3,4-trihydroxybenzophenone, 2,4,4'-trihydroxybenzophenone, 2,4,6-trihydroxybenzophenone, 2,3,4-trihydroxy-2'-methylbenzophenone, 2,3,4,4'-tetrahydroxybenzophenone, 2,2'4,4'-tetrahydroxybenzophenone, 2,4,6,3',4'-pentahydroxybenzophenone, 2,3,4,2',4'-pentahydroxybenzophenone, 2,3,4,2',5'-pentahydroxybenzophenone, 2,4,6,3',4',5'-hexahydroxybenzophenone, and 2,3,4,3',4',5'-hexahydroxybenzophenone.

Some examples of inventive DNQs include:

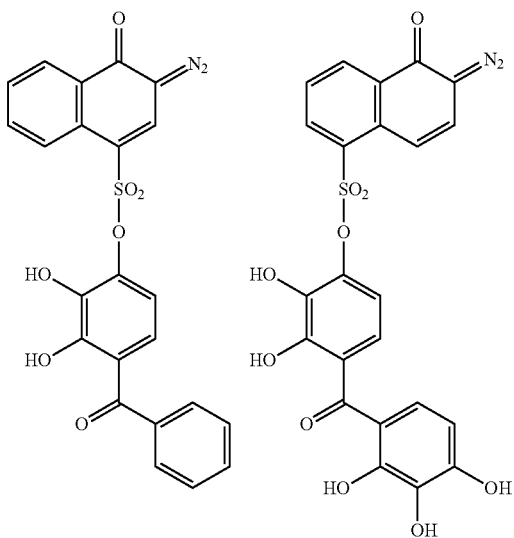

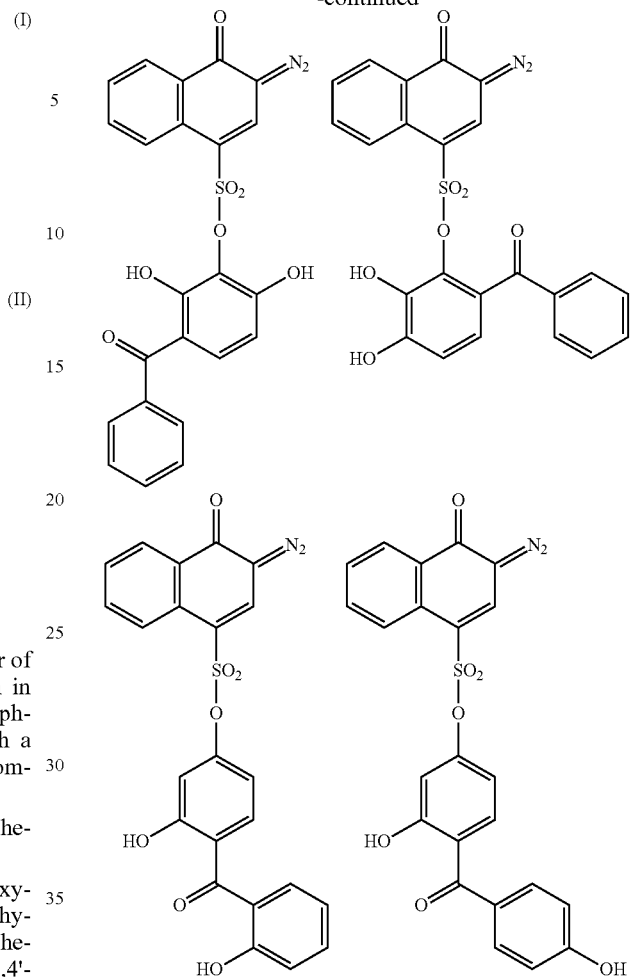

Particularly preferred 2-diazo-1-naphthoquinone-4-sulfonate esters are those derived from 2,3,4-trihydroxybenzophenone and 2,3,4,4'-tetrahydroxybenzophenone, either as a single isomer or a mixture of isomers.

The % of the diazonaphthoquinone sulfonic ester of a polyhydroxybenzophenone compound in the photoresist should be at least 1% and no more than 8%, and preferably in the range of 1.5% to 5%.

Other PACs may be used in combination with the inventive diazonaphthoquinone sulfonic ester of a polyhydroxybenzophenone compound including other non-polyhydroxybenzophenone diazonaphthoquinone sulfonate esters. For example, it is well known that diazonaphthoquinone sulfonyl choride can be reacted with a cresol novolak resin to incorporate a diazonaphthoquinone moiety directly as part of the resin. However, while there may be free hydoxyl groups present in the diazonaphthoquinonyl resin, there are no benzophenone groups. While such polymeric DNQs are not the DNQ of the invention, they may be used together in the same solution.

The method of the invention uses a photoresist composition that also contains a non-ionic urethane polyglycol fluorosurfactant. A non-ionic surfactant will not contain a group that is ionized or charged under the conditions of its use. Some example of possible ionizable or charged groups would include sulfonic or carboxylic acids or salts thereof, amines (under acidic conditions) or quaternary amino groups and are excluded. An urethane group is —N(R)—CO—O— where R is a H, alkyl or aryl group. A glycol is any of a class of organic compounds belonging to the alcohol family where two hydroxyl (—OH) groups are attached to different carbon atoms. A polyglycol is a dihydroxy ether derived from the dehydration (removal of a water molecule) of two or more glycol molecules. A fluorosurfactant is a synthetic organofluorine chemical compound that has multiple fluorine atoms. They can be polyfluorinated or fluorocarbon-based (perfluorinated). In any case, they generally will have hydrophobic regions that are highly fluorinated together with other regions that are hydrophilic. They will contain enough fluorine atoms to be effective at lowering the surface tension of water than comparable hydrocarbon surfactants. Compounds with relatively few fluorine atoms may not provide these desirable surfactant properties.

The non-ionic urethane polyglycol fluorosurfactant of the invention desirably contains poly(ethylene glycol) or poly(propylene gylcol) groups to provide a hydrophilic region of the fluorosurfactant. Poly(ethylene glycol) has the form of H—($OCH_2CH_2$)$_n$—OH where n is a variable number (desirably, at least 3 but no greater than 100, preferably no greater than 25) and a poly(ethylene glycol group) is where one or both oxygens are attached to the rest of the molecule. Likewise, poly(propylene glycol) has the form of H—(OCH($CH_3$)$CH_2$)$_n$—OH where n is a variable number (desirably, at least 3 but no greater than 100, preferably no greater than 25). For both poly(ethylene glycol) groups and poly(propylene glycol) groups, one or both oxygens can be attached to the rest of the molecule. Free end hydroxyl groups of the poly(glycol) substituent may be capped by replacement of the hydrogen with a suitable group.

The non-ionic urethane glycol fluorosurfactant of the invention desirably contains a group derived from a perfluoroalkyl group with a terminal hydroxyl or carboxyl group. The perfluoroalkyl group may be straight chain or branched and may have from 2 to 25 carbon atoms, desirably 2 to 10, in total. It should also be understood in the context of this invention that "perfluoroalkyl" includes non-aromatic chains of —($CF_2$)— that may be separated by a heteroatom such as oxygen. For example, groups such as $CF_3CF_2$—O—$CF_2CF_2$— or $CF_3CF_2CF_2$—O—CF($CF_3$)— (see Wang et al, Environmental Internat., 60, 242 (2013)) are included as perfluoroalkyl groups for this purpose. It should also be understood in the context of this invention that "perfluoroalkyl" may include nonfluorinated linking groups between the perfluoroalkyl group and the terminal hydroxyl or carboxyl group. For example, a desirable perfluoroalkyl group with a terminal alcohol would include 2-(perfluoroalkyl) ethanol ($CF_3(CF_2)_nCH_2CH_2OH$; see U.S. Pat. No. 4,219,680; also known as Zonyl® BA fluorotelomer intermediate) which is readily available. In this case, the linking group is —$CH_2CH_2$—. Another desirable perfluoroalkyl alcohol is N-alkyl-N-(2-hydroxyethyl)perfluoroalkyl-sulphonamide ($CF_3(CF_2)_nSO_2NR(CH_2CH_2OH)$), which is also available. In this case, the linking group is —$SO_2NR(CH_2CH_2)$—. Other desirable groups are derived from perfluoroalkyl carboxylic acids, which are widely available as well.

It is preferred that the non-ionic urethane polyglycol fluorosurfactant of the invention contains both a polyethylene glycol) group together with a group derived from a perfluoroalkyl group with a terminal hydroxyl or carboxyl group. There may be multiple groups of each type as well.

Such surfactants with polyglycol and perfluoroalkyl regions can be prepared as for example, described in U.S. Pat. Nos. 5,350,795, 4,792,354, 5,491,261, 5,509,939 and 5,039,739. It should be understood that such surfactants are typically not single discrete compounds but are mixtures of positional and chain length analogs and are often manufactured by a proprietary product-by-process procedures.

Commercially available examples of this type of non-ionic urethane fluorosurfactant include FluorN 562™ (Cytonix LLC; listed as Poly(propylene glycol) bis[(1,3,3 trimethyl, 1-(methoxy-poly(ethylene glycol))urethane, 5 (2-perfluoroalkyl ethanol)urethane)-isophorone] or Poly [oxy-9-methyl-1,2-ethanediyl)], α-hydro-ω-,diether with α-[[[5-(carboxyamino)-2-hydroxy-1,3,3,-trimethylcyclohexyl]amino]carbon]-ω-methoxypoly(oxy-1,2-ethanediyl), bis(γ-ω-perfluoro-$C_{6-10}$-alkyl) esters and Surflon S-243™ (AGC Seimi Chemical Co., Ltd).

As is well known in the art, the photoresist composition will generally contain a volatile non-permanent solvent to assist in coating and spreading the composition over the substrate prior to exposure and development in a photolithiographic process. Typically, the photoresist composition may be deposited via a solution process wherein the materials are dissolved or suspended in a solvent that is orthogonal to the substrate layer or other elements present on the substrate surface.

The solvent may be water, a mixture of water and a miscible organic solvent or entirely an organic solvent, which is preferred. The organic solvent may contain fluorine. Useful examples of non-aqueous solvents include methoxy-2-propyl acetate (PGMEA), ethyl lactate, methylisobutylketone, methyl ethyl ketone and ethyl acetate. Some examples of fluorinated non-aqueous solvents include Cytop-809M™ (commercially available from Asahi Glass), FC40™, FC43™, FC75™ (all commercially available from Dupont) or HFE7000™ (commercially available from 3M).

Examples of suitable solution processes include spray-, dip-, web- or spin coating, gravure printing, screen printing, spray-on, ink-jet, embossing, dispensing or block printing. In any case, the photoresist composition is uniformly deposited over the entire useful surface of the device prior to photopatterning.

The inventive photoresist is used in a photolithiographic process to create bank structures that form a well on a substrate. As defined herein, the terms "photoresist", "photoresist resin", "photoresist composition", "photoresist formulation", "photoresist polymer", "photo-patternable" and "photoresist process" are used interchangeably and refer to the materials and processes well known in the art of photolithography. Unless specifically defined, the materials and process can be positively or negatively working as well known in the art. In the context of this invention, the exposure and development processes for photolithography to create the well-defining bank structures using the inventive photoresist composition are, in general, not critical. The photoresist composition may also be used in immersion photolithography processes as well. It is well within the ability of one skilled in the art to design, test and select appropriate processes to provide the desired bank structures.

A typical photolithography process involves the steps of cleaning and preparing the substrate, drying the substrate, spin-coating the photoresist composition, softbake (typical conditions range from 65° C. for 120 s to 95° C. for 300 s), cooling down, radiation exposure (typical conditions range from 165 to 200 mJ/cm$^3$), post-exposure-bake (optional; typical conditions range from 2 to 120 min at 50 to 120° C. for this step when used), cool to room temperature, relaxation time, development, rinsing and dry spinning and a hard bake at 50 to 180° C. for 5 to 120 min. It should be understood that a heat treatment is necessary after photoprocessing, but the appropriate times and temperatures will depend on the nature of the materials used and can be readily determined by simple experimentation.

As used herein, the term "polymer" will be understood to mean a molecule that encompasses a backbone of one or more distinct types of repeating units (the smallest constitutional unit of the molecule) and is inclusive of the commonly known terms "oligomer", "copolymer", "homopolymer" and the like. Further, it will be understood that the term polymer is inclusive of, in addition to the polymer itself, residues from initiators, catalysts and other elements attendant to the synthesis of such a polymer, where such residues are understood as not being covalently incorporated thereto. Further, such residues and other elements, while normally removed during post polymerization purification processes, are typically mixed or co-mingled with the polymer such that they generally remain with the polymer when it is transferred between vessels or between solvents or dispersion media.

As used herein, the term "polymer composition" or "photoresist composition" means at least one polymer (a cresol novolak resin) and one or more other materials may be added (in addition to the polyhydroxybenzophenone DNQ and the non-ionic urethane fluorosurfactant) to the at least one polymer to provide, or to modify, specific properties of the polymer composition and or the at least one polymer therein. It will be understood that a polymer composition is a vehicle for carrying the polymer to a substrate to enable the forming of layers or structures thereon. Exemplary additional materials include, but are not limited to, surfactants, dyes, solvents, antioxidants, photoinitiators, photosensitizers, crosslinking moieties or agents, reactive diluents, acid scavengers, leveling agents and adhesion promoters.

Further, it will be understood that a polymer composition may, in addition to the aforementioned exemplary materials, also encompass a blend of two or more polymers.

As used herein, the term "bank structure(s)" will be understood to mean a patterned structure, for example a patterned layer, that is provided on an underlying substrate and defines a specific structure, for example a well, on said substrate that can be filled by an active or functional material like a dye, semiconductor or a dielectric. The patterned bank structure comprises a well-defining material that is selected such that a surface energy contrast is created between said patterned bank structure and the substrate upon which it rests. Usually the substrate has a higher surface energy while the patterned bank structure has a lower surface energy. The insulating structure or bank structure is used to define more easily the active area of a solution-processed thin film of, for example, the semiconductor in an electronic device, by using the tendency of the liquid solution to move and stick to the area having higher surface energy, i.e., the substrate. By confining the liquid in a given area, a thin film can be formed as needed in the specific device application.

As used herein, the term "substrate' will be understood to mean that base on which the well-defining bank structures and functional materials within the well are located. Substrates generally consist of a solid support which can be rigid (for example, glass or thick metal) or flexible (for example, plastic or thin metal). The substrate may be transparent or opaque. The support may have multiple subbing layers which can be either uniform over the entire surface or patterned. Examples of uniform subbing layers include insulating layers, separation layers, light-absorbing opaque layers, reflective layers, scattering layers, anti-halation layers, planarization layers, adhesion layers and the like.

Examples of patterned subbing layers include light-shielding layers, insulating layers, metallization layers, adhesion layers and the like. For many types of optoelectronic devices, there will be control elements located on the support either under or adjacent to the active areas of the device. These control elements (for example, TFT circuits) generally receive signals and power from circuitry located in other locations within the device and subsequentially supply and send signals and power to the active areas. These connections are through busses or lines of conductive metals located in the substrate. All portions of any control structures should be considered part of the substrate.

Figure 2A:
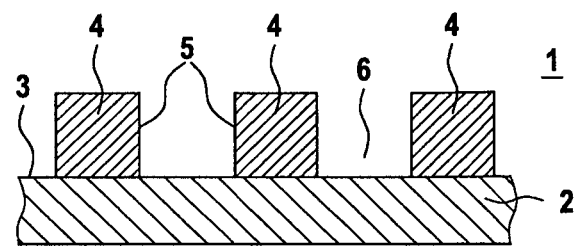
FIG. 2a is a schematic representation of a side view of one embodiment of a substrate with patterned bank structures formed by the inventive method.
Figure 2B:
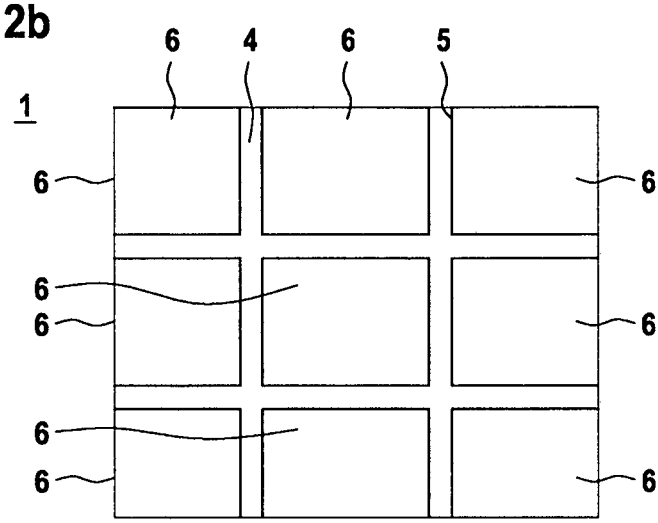
Figure 2C:
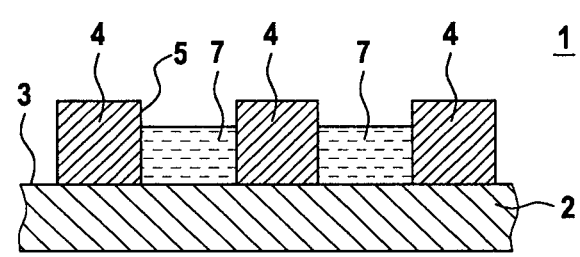
FIG. 2c is a side view as in FIG. 2a after the addition of an active layer.

As discussed above, the invention relates to a substrate with patterned bank structures that define a well that confines an active layer where the bank structures are formed from a particular photoresist formulation by a photolithiographic process. FIGS. 2a to 2c show a schematic representation of a part of a substrate with patterned bank structures 1 in accordance with the present invention. In FIG. 2a, there is a substrate 2 with an upper surface 3 on which lies a pattern of bank structures 4 formed from a photoresist composition containing cresol novolak resin, a diazonaphthoquinone sulfonic ester of a polyhydroxy benzophenone compound and a non-ionic urethane polyglycol fluorosurfactant. The bank structures have wall edges 5 that are non-parallel to the substrate surface 3. A well area 6 extends between the wall edges 5 and the upper substrate surface 3. As illustrated in FIG. 2b in a plane view for one embodiment (a square grid pattern), the well area 6 is defined by the wall edges 5 of the bank structures 4 and the upper surface of the substrate 3. FIG. 2c shows where active material(s) have been introduced into the well area (also referred to as the active area) 6 to form at least one active layer(s) 7 which overlies the substrate surface 3 and extends between the walls 5 of the bank structures.

The formation of the active layer(s) 7 is accomplished by introducing the appropriate active materials in a liquid form or as a solution in a solvent into the wells defined by the bank structures. When a solvent is used for applying a solution of active material(s) to form the active layer(s), it may be aqueous (either water only or a mixture of water and a miscible organic solvent) or an organic solvent. The method for applying the materials for the active layer(s) is not critical and may be carried out using a technique such as ink-jet, dispenser, nozzle coating, intaglio printing, letterpress printing or the like. Ink-jet methods are preferred.

When the liquid containing the active material is applied with the dispenser, liquid discharge from the dispenser is preferably controlled by suck-back operation or the like at the beginning and the end of the application. In some embodiments, the active layers remain in a liquid form. In other embodiments, the active materials are in liquid form as applied but without solvent and if desired, solidified into the active area 6 by appropriate treatment. When the materials are in solution, the active area 6 is formed by removing the solvent by drying. Equipment, conditions and techniques for these processes are known to a person skilled in the art and are described in the literature.

Since the bank structures define a well which will contain the active layers, the height of the banks over the substrate should be at least be sufficient to prevent overflow of the active layer(s) as applied. It should be understood that in the cases when the active material is applied as a liquid or solution, the maximum height of the solution could be greater than the height of the bank structures because of its non-wetting properties. The height of the bank structure (above the substrate) should be between 500 nm to 20 μm, preferably between 0.8 and 10 μm and most preferably between 1.0 and 3 μm.

Generally the thickness of the active layer(s) 7 in some preferred electronic device embodiments according to the present invention is from 1 nm (in case of a monolayer) to 20 μm. In other embodiments such thickness ranges from 100 nm to 10 μm, and in still other embodiments from 100 nm to 1 μm, although other thicknesses or ranges of thickness are contemplated and thus are within the scope of the present invention. In any case, the thickness of the active layer(s) in their working state should not be greater than the height of the banks.

Depending on the needs of the device and the materials of the active layer, the profile of the bank structures may be positive (broader at the bottom (closest to the substrate) and narrower at the top) or negative (narrower at the bottom and broader at the top). As known in the art, these profiles can be formed as a result of the material choices and photoresist process used to form the bank structures. Positive bank structures are preferred.

Since the bank structures enclose an active area with a finite size, there will be a minimum of 3 bank structures and there must be some minimum distance between any two banks (or opposing sections of the bank if the bank is non-linear). Since the active area is not limited to any particular shape, the banks do not necessarily have to be linear or parallel to each other. The shapes of the wells (and the resulting active areas) can include, but are not limited to, stripes, rectangles, squares (as shown in FIG. 2*b*), diamonds, trapezoids or triangles. Any of these may have rounded corners at intersections where straight lines meet. The shapes may also be those without any linear sides such as ovals or circles.

The minimum width of the active area is a matter of device type and design since these factors influence the resolution. This is because as the banks structures become wider, the active areas will be farther apart from each other. For example, for an OLED where the active areas are rectangular in shape, the following table shows one representative relationship between these elements for one display size:

| Display Resolution (pixels per inch) | Width of Active Area (μm) | Bank Width (μm) |
| --- | --- | --- |
| 100 | 75 | 10 |
| 200 | 32 | 10 |
| 300 | 23 | 5 |
| 400 | 16 | 5 |
| 500 | 12 | 5 |

It is desirable for many embodiments that the total of the two opposing bank widths should be less than the width of the active area in order to minimize the distance between active areas. It is preferred that the minimum width of the active area be at least 1.5 times, and more preferably 2 times, the width of two opposing banks in the same direction as the minimum width of the active area. For example, if the bank width of each bank is 10 μm, the total width is 20 μm, so the minimum width of the active area should be at least 30 μm, or more preferably, at least 40 μm. It is understood that one skilled in the art would be able to determine the size of the active areas and banks appropriately based on the type, aims and design of the device.

In one embodiment, the substrate is transparent and the active area is colored. Each active area forms a cell, separated from each other by the bank structures, which filters light passing through it. If different colored materials are used in different cells, a color filter array is formed. Suitable colored materials for color filter arrays are well known. The colored materials may be organic dyes or inorganic pigments suspended in an organic matrix. In color filter embodiments, it may be useful to add a black dye to the photoresist composition or otherwise prevent light from passing through the banks in order to prevent crosstalk between cells.

Other embodiments can include making an organic electronic (OE) device, for example, a top gate or bottom gate Organic Field Effect Transistor (OFET), including Organic Thin Film Transistors (OTFTs), an Organic Light Emitting Diode (OLED) or an Organic Photovoltaic (OPV) device (which includes both solar cells as well as photosensors).

Embodiments of the present invention are also inclusive of a product or an assembly comprising an organic electronic device as described above and below. Such product or assembly being an Integrated Circuit (IC), a Radio Frequency Identification (RFID) tag, a security marking or security device containing an RFID tag, a Flat Panel Display (FPD), a backplane of an FPD, a backlight of an FPD, an electrowetting device, an electrophotographic device, an electrophoretic device, an electrophotographic recording device, an organic memory device, a sensor, a biosensor or a biochip. The invention further relates to a process of preparing an organic electronic device, like a top gate OFET or bottom gate OFET, comprising one or more bank structures as described hereinafter. As used herein, the term Organic Field Effect Transistors (OFET) will be understood to be inclusive of the subclass of such devices known as Organic Thin Film Transistors (OTFTs). In addition, it will be understood that, as used herein, the term "organic electronic device" will be understood to be inclusive of the term "organic semiconductor device" and the several specific implementations of such devices such as the OFETs as defined above.

Figure 3A:
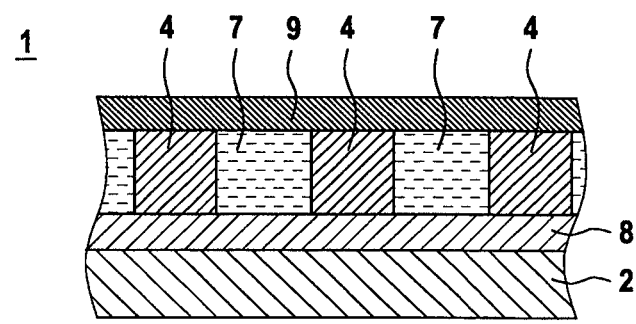
FIG. 3a is a schematic representation (side view) of one embodiment of an electronic device with an active layer between two conductive layers that are separated by bank structures and where both conductive layers are continuous over and under the bank structures.
Figure 3B:
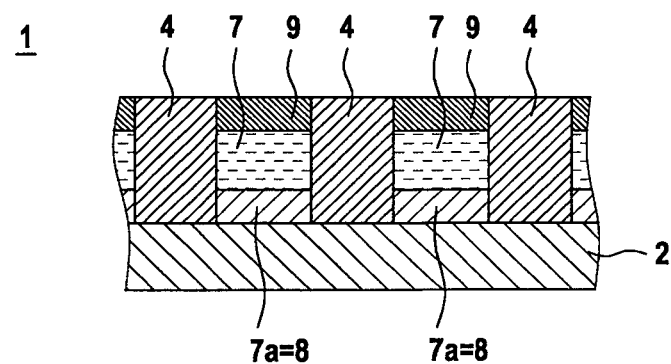
FIG. 3b shows (side view) of another embodiment of an electronic device where the two conductive layers are both located between the bank structures.

As shown in FIGS. 3*a* and 3*b*, these OE devices require having an active or functional layer 7 (in the well area 6 bounded by the banks 4) located between two (8 and 9) electrically conductive layers (electrodes) of opposite charge. As used herein for OE embodiments, an "active" or "functional" (terms that can be used interchangeably) layer is one composed of materials that whenever a current or a charge is applied across the two conductive layers, the materials cause a desirable effect.

For example, in an OTFT, source and drain electrodes are separated by an active layer 7 (an organic semiconductor) with a thin film of insulator deposited between the organic semiconductor and a third (gate) electrode. When a charge is applied to the gate, the active layer 7 changes its conductive properties, thereby serving as an electrical switch between the source and drain electrodes. For an OLED, application of current between the conductive layers will cause light emission. It should be understood that an "active layer" may include any number of layers that are necessary to provide the desired effect. The "active area" 6 of the OE device are those areas which are energized by the electrically conductive layers and produce the desired effect. For example, the "active area" of an OLED would correspond to the area of the light-emitting pixel.

Appropriate active layer(s) and material(s) therein can be selected from standard materials, and can be manufactured and applied to the electronic device by standard methods. The active material(s) are selected for the purpose of the device and may be organic or inorganic as needed. It should be noted that inorganic active materials in an organix matrix should be considered "organic" for the purposes of this invention. For example, an organic thin-film transistor (OTFT) has an active layer 7 which is an organic semiconducting or charge-carrying material; a TFT has an active layer 7 which is an inorganic semiconducting material in an organic matrix; an electrowetting (EW) device has an active layer 7 containing a colored liquid; an organic photovoltaic device (OPV) has an active layer 7 containing a photoactive material; an electroluminescent (EL) device has an active layer 7 containing a material that emits light; and an electrophoretic (EP) device has an active layer 7 containing charged pigment particles dispersed in a liquid. Suitable materials and manufacturing methods for these devices, their components and layers are known to a person skilled in the art and are described in the literature.

As defined herein and shown in FIGS. 3a and 3b, layer 8 is a first conductive layer is an electrically conductive layer in contact with the substrate 2. It may be uniform across the usable surface of the substrate or it can be patterned; that is, it is not uniform across the surface of the substrate but is broken up into individual sections according to a regular pattern. As shown in FIG. 3a, all or sections of the first conductive layer can underlie (and be larger than) the active area 6 and active layer(s) 7 of the device and the well-defining bank structures 4. This embodiment is preferred. Alternatively, as shown in FIG. 3b, there is at least a first (7a) and second active layer (7b) where the first active layer in contact with the substrate is electrically conductive, and the second active layer is in electrical contact with a second overlying electrically conductive layer. Thus, in this embodiment, the first active layer 7a serves as the first conductive layer 8 and lies completely within the active area 6 and is enclosed by the bank structures 4. In both of these embodiments, the terms "first conductive layer" and "bottom electrode" can be used interchangeably. In practice, each section is connected to a control element that supplies signal and charge through an electrical bus or wiring layers (these are not shown in FIG. 3a or 3b). It may supply negative charge (for example, as in a cathode) or positive charge (for example, as in an anode). As defined herein, the second conductive layer 9 (which can also be referred to as a "top electrode") will overlie the active layers 7 and the first conductive layer 8. It may be patterned in register with the first conductive layer 8 (as illustrated in FIG. 3b but may be applied to the embodiment of FIG. 3a as well) or extend uniformly over all the active areas (as illustrated in FIG. 3a but may still be applied to the embodiment of FIG. 3b as well). Second conductive layer 9 will carry a charge that is opposite to the first conductive layer 8. The first conductive layer, along with any associated wiring or electrical conductors, may be patterned into sections using known photolithographic techniques on the substrate. The second conductive layer is generally applied by sputtering or other vaporization techniques since the underlying active layers are not generally compatible with photolithography. Patterning of the second conductive layer, when desired, generally requires the use of shadow masks. However, other non-vaporization techniques such as printing can also be used.

For OLEDs, one of the conductive layers should be transparent or nearly transparent (for example, be composed of a transparent metal oxide or a very thin layer of a metal) and the other reflective (for example, a thick layer of metal). For a bottom-emitting OLED, the first conductive layer should be transparent and the second conductive layer should be reflective. For a top-emitting OLED, the first conductive layer should be reflective and the second conductive layer should be transparent.

Suitable electrode materials and deposition methods are known to the person skilled in the art. Such electrode materials include, without limitation, inorganic or organic materials, or composites of the two. Exemplary electrode materials include polyaniline, polypyrrole, poly(3,4-ethylenedioxythiophene) (PEDOT) or doped conjugated polymers, further dispersions or pastes of graphite or particles of metal such as Au, Ag, Cu, Al, Ni or their mixtures as well as sputter-coated or evaporated metals such as Cu, Cr, Pt/Pd, Ag, Au, Mg, Ca, Li or mixtures or metal oxides such as indium tin oxide (ITO), F-doped ITO, GZO (gallium doped zinc oxide), or AZO (aluminium doped zinc oxide). Organometallic precursors may also be used and deposited from a liquid phase.

The invention will now be described in more detail by reference to the following examples, which are illustrative only and do not limit the scope of the invention. Above and below, unless stated otherwise, percentages are percent by weight and temperatures are given in degrees Celsius (° C.).

Working Example 1

A photoresist formulation of a commercially available cresol novolak resin mixture CNR1 (10 parts; composition below) and fluorinated materials A, B, C and D (1 part) at a weight ratio of resin:fluorinated material of 2.3:1 was spin-coated at a thickness of 2 μm onto a layer of ITO of 50 nm thickness on a glass substrate. The photoresist was soft-baked on a hotplate at 90 to 100° C. for 2 min to remove the solvent. Then, the photoresist was exposed using 365 nm UV light with a photomask using mask aligner. The exposed sample was developed in 2.5% TMAH aqueous solution followed by DI water rinsing for several time before blow-drying and hard baking between 130 to 180° C. on a hot plate for 1 to 30 min.

CNR1 contains 23% cresol novolak resin, 3% of a 2-diazo-1-naphthoquinone sulfonate ester of 2,3,4-trihydroxybenzophenone (an inventive DNQ), 1% 2,6-bis(hydroxymethyl)-p-cresol crosslink agent, 0.01% siloxane dispersing agent and 73% 1-methoxy-2-propylacetate.

Comparative fluorocarbons A and B are non-polymeric maleimides with the following structure:

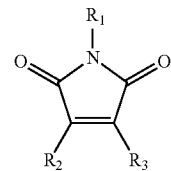

where $R_1$ is an alkyl group with a terminal trifluoromethyl group and $R_2$ and $R_3$ are H or alkyl. Comparative fluorocarbon C is a non-polymeric maleimide where $R_1$ contains a monofluorinated aryl group and $R_2$ and $R_3$ are alkyl. These fluorocarbons are not urethanes nor contain poly(glycol) or 2-(perfluoroalkyl) derived groups. Inventive non-ionic fluorosurfactant D contains both poly(ethylene glycol) and 2-(perfluoroalkyl)ethanol derived groups.

The contact angle ($CA_{H2O}$) of the resulting bank structures of Working Example 1 were measured and shown in Table 1. Comparative examples B and C gave similar results to comparative example A. The inventive fluorosurfactant D was effective at increasing the $CA_{H2O}$ of the bank even after processing and so, results in an improvement in its non-wetting properties.

TABLE 1

Contact Angles for Experiment 1

| Fluorinated Additive | Wt. Ratio | $CA_{H2O}$ of Bank |
| --- | --- | --- |
| No Additive | — | 79 |
| A (Comp) | 2.3:1 | 79 |
| D (Inv) | 2.3:1 | 105 |

Working Example 2

Photoresist formulations were prepared using the same procedure as Working Example 1 using the same cresol novolak resin mixture and inventive fluorosurfactant D at the indicated weight ratios using different thermal conditions. Contact angles for water ($CA_{H2O}$) of the bank and 3-phenoxytoluene ($CA_{3PT}$) for the ITO substrate were measured and shown in Table 2.

TABLE 2

Contact Angles for Experiment 2

| Sample | Ratio | Process | $CA_{H2O}$ (Bank) | $CA_{3PT}$ (ITO) |
| --- | --- | --- | --- | --- |
| ITO Only | — | Precleaned ITO | — | 27 |
| | | Hardbake 130° 1 min | — | 28 |
| | | Hardbake 130° 5 min | — | 30 |
| Resin Only | — | After photopatterning | 79 | 12 |
| | | Hardbake 130° 1 min | 73 | 11 |
| | | Hardbake 130° 5 min | 69 | 16 |
| Resin + D | 2.3:1 | After photopatterning | 105 | 21 |
| | | Hardbake 130° 1 min | 104 | 18 |
| | | Hardbake 130° 5 min | 99 | 25 |
| | 4.6:1 | After photopatterning | 107 | 16 |
| | | Hardbake 130° 1 min | 103 | 8 |
| | | Hardbake 130° 5 min | 99 | 26 |
| | 6.9:1 | After photopatterning | 105 | 6 |
| | | Hardbake 130° 1 min | 99 | 15 |
| | | Hardbake 130° 5 min | 98 | 15 |
| | 9.2:1 | After photopatterning | 106 | 4 |
| | | Hardbake 130° 1 min | 96 | 26 |
| | | Hardbake 130° 5 min | 90 | 26 |
| | 18.4:1 | After photopatterning | 98 | 19 |
| | | Hardbake 130° 1 min | 87 | 24 |
| | | Hardbake 130° 5 min | 89 | 20 |
| | 23:1 | After photopatterning | 98 | 23 |
| | | Hardbake 130° 1 min | 91 | 20 |
| | | Hardbake 130° 5 min | 81 | 19 |
| | 46:1 | After photopatterning | 92 | 25 |
| | | Hardbake 130° 1 min | 88 | 23 |
| | | Hardbake 130° 5 min | 85 | 23 |
| | 92:1 | After photopatterning | 90 | 34 |
| | | Hardbake 130° 1 min | 87 | 32 |
| | | Hardbake 130° 5 min | 86 | 27 |
| | 115:1 | After photopatterning | 88 | 9 |
| | | Hardbake 130° 1 min | 87 | 27 |
| | | Hardbake 130° 5 min | 83 | 32 |

Note that in Table 2, the ratio of resin:inventive fluorosurfactant is greater than 2:1, desirably 10:1 or less, and more desirably 7:1 or less in order to obtain larger improvements in the non-wetting properties of the bank structures. This is particularly desirable when the active material is introduced into the well from an aqueous solution. The wetting properties of the ITO substrate is improved after the photoresist process and much of the improvement is retained in the presence of the inventive fluorosurfactant. This is desirable for embodiments where the active material is introduced using organic solvents and will promote uniform film thickness across the well. In terms of the wetting properties of the substrate, the ratio of resin:inventive fluorosurfactant is desirably 7:1 or more, and preferably within the range of 7:1 to 100:1, or more preferably 7:1 to 50:1. In consideration of achieving both of these desirable properties simultaneously, a desirable range would be 1:1 to 25:1 and more preferably, 2:1 to 10:1. It should be understood that the most desirable ratio will depend on the nature of the materials involved and the needs of the system and can be readily determined by simple experimentation.

Working Example 3

An ITO (50 nm thickness)/glass substrate was precleaned using an organic solvent and spin-dried followed by a 10 min UV ozone treatment. Next, a photoresist composition of CNR1 and fluorosurfactant Data resin:D ratio of 4.6:1 was spin-coated on top of the ITO/glass substrate and soft baked at 100° C. for 2 min to create a 2.0 µm thick film. Using a photomask, the sample was irradiated with 365 nm UV at a dosage 140 to 160 mW/cm². The sample was then developed using 2.5% TMAH aqueous solution for 20 to 40 sec followed by a deionized water wash for further removal of developer residue to form bank structures. The sample was blow-dried and hard baked at 130° C. for 1 min. Three different photomasks were used to create banks that formed rectangular well areas with rounded corners of 74 µm×222 µm, 60 µm×180 µm and 40 µm×120 µm. These well areas were then filled using a inkjet process with a 2.5% solution of active materials (TH1, TH-2 and TE-1 (see below) in a ratio 40:40:20) in 3-phenoxytoluene.

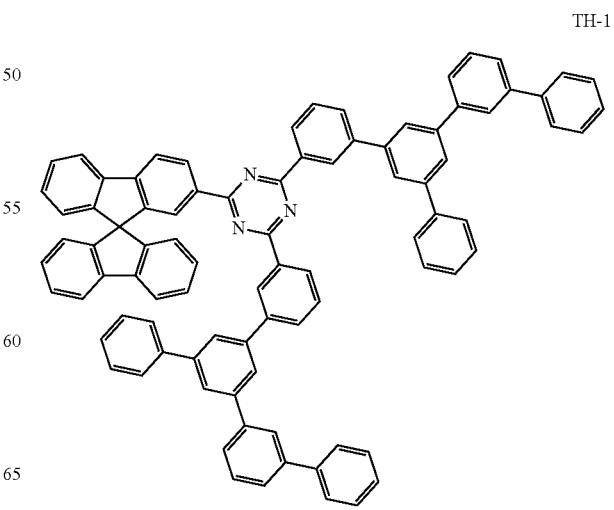

TH-1

-continued

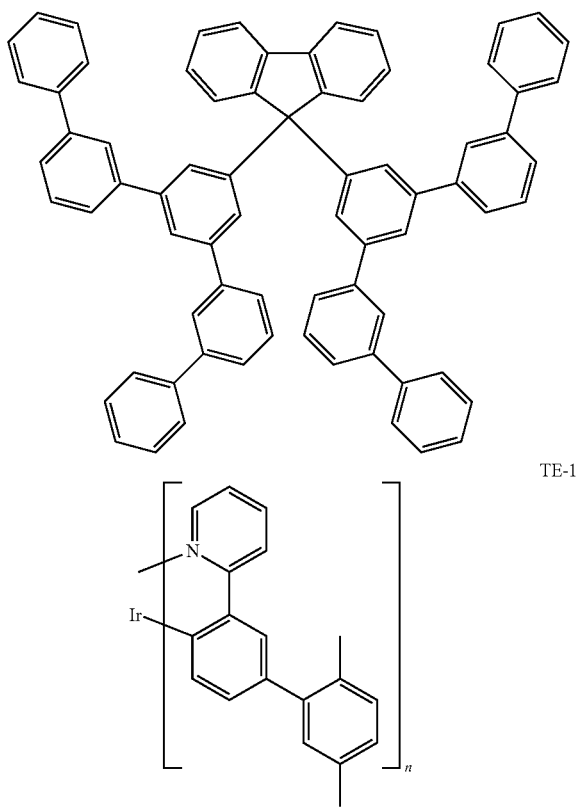

TH-2

TE-1

Figure 4A:
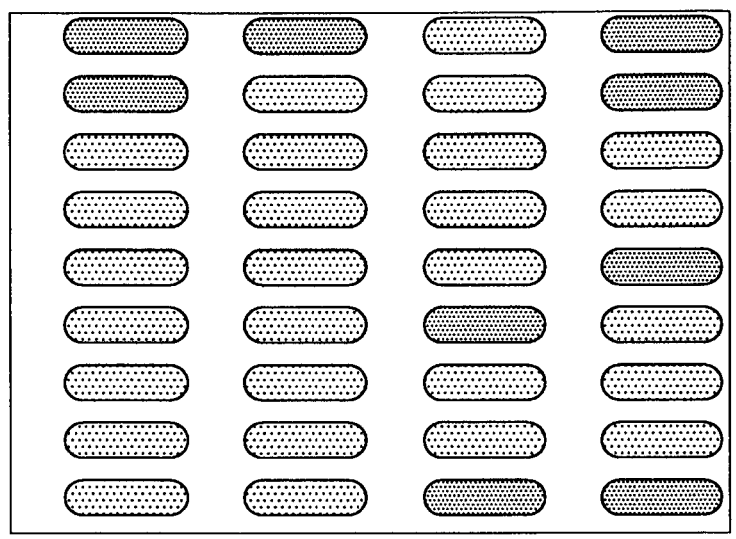
FIGS. 4a to 4c (plane view) shows a glass/ITO/bank structure of the invention where 3 differently sized wells formed by the banks were filled with an OLED green emissive material using an inkjet process.
Figure 4B:
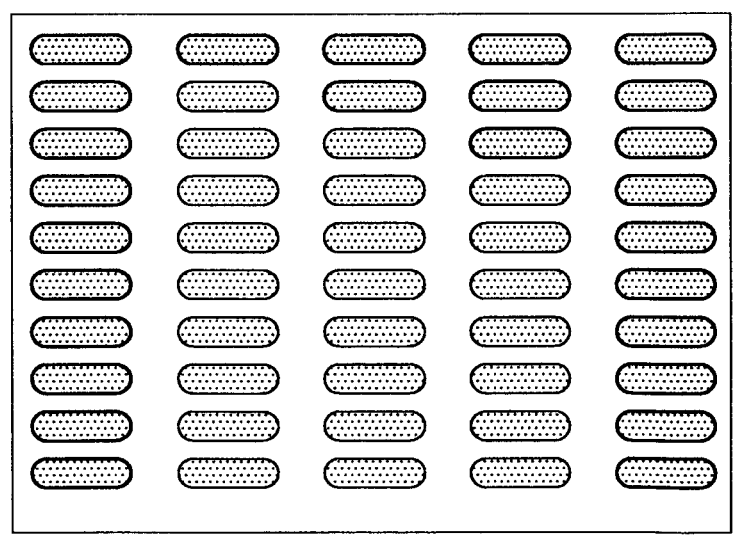
Figure 4C:
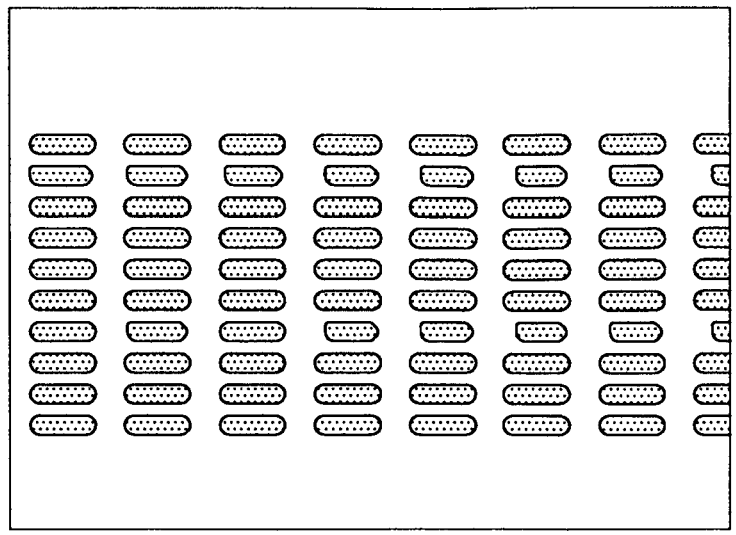
Figure 4D:
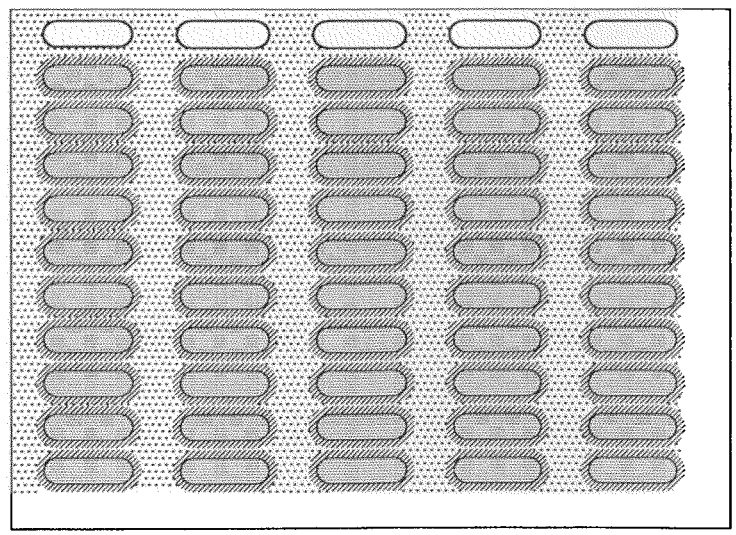
FIG. 4d shows the effect of overspilling ink formulation all over the well and the bank when low contact angle bank was used.
Figure 4E:
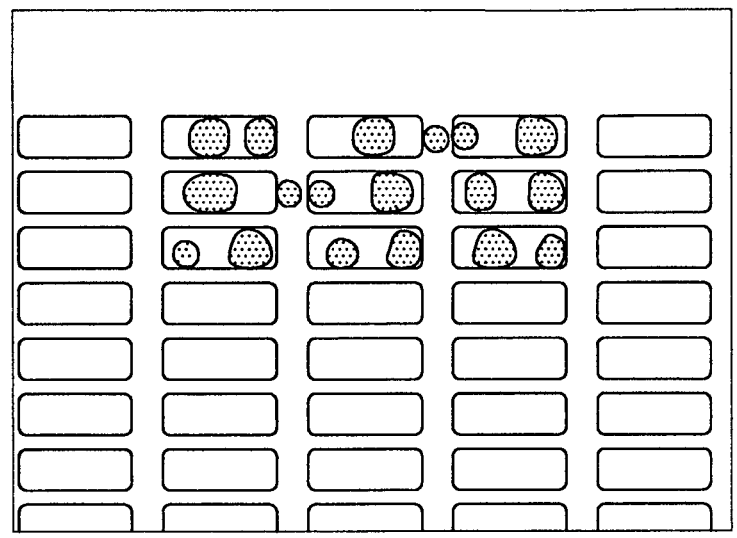
FIG. 4e shows the non spreading of inkjet printed ink inside the well when high contact angle of active surface were used.

The resulting different sized samples are shown in FIGS. 4a to 4c (at different magnifications). FIG. 4d indicates the results when the solution of active material overspills the well area during the deposition process due to low contact angle of the banks. FIG. 4e shows the results of non-uniform coverage caused by a high contact angle substrate.

Working Example 4 (Part 1—Pretest)

An ITO (50 nm thickness)/glass substrate was precleaned using an organic solvent and spin-dried followed by a 10 min UV ozone treatment. Next, a mixture of the indicated photoresist composition resin mixtures and fluorosurfactants at a ratio of 4.6:1 was spin-coated on top of the ITO/glass substrate and soft baked at 100° C. for 2 min. The contact angle of water on the film surface was then measured ($CA_{H2O}$>100° C.). The samples were then further annealed at 180° C. for another 2 min and the water contact angle was remeasured ($CA_{H2O}$>180° C.). In Experiment 4, the ratio is the weight of resin to weight of fluorosurfactant as received (in some commercial examples, the % of fluorosurfactant may be less than 100%).

In the following examples, commercially available CNR2 is composed of 20 to 25% cresol novolak resin/diazonaphthoquinone copolymer with 2% of a 2-diazo-1-naphthoquinone sulfonate ester of tetrahydroxybenzophenone (an inventive DNQ) in ethyl lactate/n-butyl acetate solvent. CNR2 is suitable as source of cresol novolak resin and DNQ for the inventive composition. Commercially available CNR3 is composed of 38% cresol novolak resin, 4.7% of 1-naphthalenesulfonicacid, 3-diazo-3,4-dihydro-4-oxo-, ar-(1-methylethyl)[1,1'-biphenyl]-4-yl ester, 0.05% of a polymeric fluoroaliphatic ester surfactant in toluene/1-methoxy-2-propylacetate solvent. In CNR3, both the DNQ and fluorosurfactant are outside the claims so that CNR3 is not suitable as a source of DNQ or fluorosurfactant in the inventive composition. The % of resin in the formulation using CNR3 is also greater than 30% as well. Comparative commercially available non-ionic fluorosurfactant E (LF200™ from Lumiflon) is a fluoroethylene/alkylvinyl ether polymer. Comparative commercially available non-ionic fluorosurfactant F (TEGO Airex 931™ from Evonik) is a fluorinated alkyl silicon polymer. Comparative commercially available non-ionic fluorosurfactant G (Zonyl FSN™ from Dupont) is a (perfluoroalkyl)ethylene oxide oligomer. Comparative commercially available non-ionic fluorosurfactant H (FC4430 from 3M) is a fluorinated ethyl acrylate/ethylene oxide copolymer. Comparative commercially available anionic fluorosurfactant I (Trivida 2500™ from Merck) is a (perfluoroalkyloxy) acrylate derivative. Comparative non-ionic fluorosurfactant J is a (perfluoroalkyloxy) ethylene oxide polymer. None of comparative fluorosurfactants E to J are urethane derivatives.

The results are listed below in Table 3.

TABLE 3

$H_2O$ Contact Angle of Baked Resin Films (Pretest)

| Example | CNR | Fluoro-surfactant | $CA_{H2O}$ > 100° C. | $CA_{H2O}$ > 180° C. |
|---|---|---|---|---|
| 1 (Comp) | CNR1 | None | 71 | 77 |
| 2 (Inv) | " | D | 99 | 100 |
| 3 (Comp) | " | E | 92 | 84 |
| 4 (Comp) | " | F | 81 | 99 |
| 5 (Comp) | " | G | 101 | 100 |
| 6 (Comp) | " | H | 97 | 100 |
| 7 (Comp) | " | I | 8 | 7 |
| 8 (Comp) | " | F | 89 | 100 |
| 9 (Comp) | CNR2 | None | 79 | 71 |
| 10 (Inv) | " | D | 101 | 100 |
| 11 (Comp) | " | E | 88 | 86 |
| 12 (Comp) | " | F | 83 | 86 |
| 13 (Comp) | " | G | 110 | 106 |
| 14 (Comp) | " | H | 100 | 102 |
| 15 (Comp) | " | I | 54 | 38 |
| 16 (Comp) | " | J | 90 | 95 |
| 17 (Comp) | CNR3 | none | 74 | 79 |
| 18 (Comp) | " | D | 90 | 94 |
| 19 (Comp) | " | E | 81 | 86 |
| 20 (Comp) | " | F | 74 | 82 |
| 21 (Comp) | " | G | 99 | 99 |
| 22 (Comp) | " | H | 57 | 94 |
| 23 (Comp) | " | I | 15 | 6 |
| 24 (Comp) | " | J | 93 | 98 |

The results in Table 3 are a pretest since the resin films have not been exposed and developed to form bank structures. In these screening experiments, the contact angles for water should be at least 90 degrees. Under these conditions, some of the comparative compositions had similar initial results to the inventive compositions.

Working Example 4 (Part 2)

The films from Part 1 that had an initial $CA_{H2O}$ of at least 90 degrees were remade using the same process, following by exposure (using a mask aligner) of half of the substrate with 365 nm UV at a dosage of around 150 mW/cm² and subsequently developed with 2.5% aqueous TMAH, followed by water rinsing, spin drying and baking at 100° C. for 2 min to remove any residual water. This forms a developed area of photoresist (bank structure) along with an area of uncovered ITO where the photoresist was removed during the process. The CA for water and 3-phenoxytoluene were then measured on both the bank structure and on the ITO surface, followed by a further annealing at 180° C. for 2 min. The contact angles were then remeasured.

The results for Part 2 of Example 4 are shown in Table 4:

TABLE 4

Contact Angles of ITO and Developed Banks (Pretest)

| | >100° C. | | | >180° C. | | | |
|---|---|---|---|---|---|---|---|
| | $CA_{H2O}$ | | $CA_{3PT}$ | $CA_{H2O}$ | | $CA_{3PT}$ | |
| Example | ITO | Bank | ITO | ITO | Bank | ITO | Bank |
| 2 (Inv) CNR1:D | 50 | 98 | 9 | 73 | 93 | 23 | 69 |
| 3 (Comp) CNR1:E | 59 | 95 | 18 | 79 | 83 | 26 | 28 |
| 4 (Comp) CNR1:F | 43 | 81 | 9 | 71 | 86 | 21 | 38 |
| 5 (Comp) CNR1:G | 55 | 109 | 24 | 75 | 95 | 18.5 | 17 |
| 6 (Comp) CNR1:H | 71 | 98 | 32 | 75 | 97 | 34 | 72 |
| 7 (Comp) CNR1:F | 57 | 100 | 26 | 75 | 94 | 36 | 65 |
| 10 (Inv) CNR2:D | 47 | 96 | 12 | 12 | 102 | 28 | 71 |
| 13 (Comp) CNR2:G | 53 | 105 | 23 | 23 | 88 | 29 | 25 |
| 14 (Comp) CNR2:H | 73 | 97 | 42 | 43 | 97 | 46 | 74 |
| 16 (Comp) CNR2:F | 55 | 87 | 38 | 38 | 86 | 42 | 62 |
| 17 (Comp) CNR3:D | 52 | 81 | 40 | 74 | 98 | 36 | 71 |
| 20 (Comp) CNR3:G | | | Did not pattern | | | | |
| 21 (Comp) CNR3:H | 74 | 92 | 36 | 74 | 92 | 38 | 74 |
| 23 (Comp) CNR3:F | 48 | 93 | 33 | 76 | 93 | 41 | 65 |

It is desirable that after heat treatment, the $CA_{H2O}$ of the bank structure should be greater than 90 degrees and the $CA_{3PT}$ of the substrate surface is preferably 30 degrees or less, more preferably 20 degrees or less and most preferably, 10 degrees or less. Moreover, it is preferred that the $CA_{3PT}$ of the substrate surface be at least 1, or more preferably, 2 degrees or more. These values provides the best degree of preventing wetting of the film onto the bank structures when it is introduced as a solution along with organic film uniformity within the well. For example, inventive examples 2 (CNR1:D) and 10 (CNR2:D) have a $CA_{3PT}$ of 23 and 28, respectively, after a heat treatment of 180° C. However, comparative example 17 (CNR3:D), which contains a non-inventive DNQ, has a $CA_{3PT}$ of 36 after 180° C. even in the presence of the inventive urethane polyglycol fluorosurfactant. Moreover, comparative examples 7 (CNR1:F; $CA_{3PT}$=36 after 180° C.) and 16 (CNR2:F; $CA_{3PT}$=42 after 180° C.), both of which have inventive DNQs but a non-inventive non-ionic (perfluoroalkyloxy)ethylene oxide surfactant (which lacks an urethane group) fail to provide the desired low degree of wettability of the ITO surface. Likewise, comparative examples 5 (CNR1) and 13 (CNR2) with another non-inventive nonionic (perfluoroalkyloxy)ethylene oxide surfactant (which lacks an urethane group) had $CA_{3PT}$ of 24 and 23 after 100° C. treatment, respectively, compared to a $CA_{3PT}$ of 9 for inventive example 2. In addition to having a low $CA_3PT$ for the ITO, the inventive compositions (examples 1 and 10) maintained a high $CA_{3PT}$ for the bank as well (69 and 71, respectively). None of the comparative examples had both low $CA_{3PT}$ for the ITO and a high $CA_{3PT}$ for the bank.

Unless the context clearly indicates otherwise, as used herein plural forms of the terms herein are to be construed as including the singular form and vice versa.

It will be appreciated that variations to the foregoing embodiments of the invention can be made while still falling within the scope of the invention. Each feature disclosed in this specification, unless stated otherwise, may be replaced by alternative features serving the same, equivalent or similar purpose. Thus, unless stated otherwise, each feature disclosed is one example only of a generic series of equivalent or similar features. All of the features disclosed in this specification may be combined in any combination, except combinations where at least some of such features and/or steps are mutually exclusive. In particular, the features of the invention are applicable to all aspects of the invention and may be used in any combination. Likewise, features described in non-essential combinations may be used separately (not in combination).

The invention claimed is:

1. A method for fabricating bank structures that define well regions on a substrate comprising in order, the steps of:
   a. preparing a solution comprising a cresol novolak resin, a photoactive diazonaphthoquinone sulfonic ester of a polyhydroxybenzophenone compound with at least one free hydroxyl group, and a non-ionic urethane polyglycol fluorosurfactant;
   b. coating the solution over the substrate to form a film;
   c. heating the coated substrate to remove any solvent;
   d. using a radiation source and a photomask to expose the coated substrate in a pattern;
   e. developing the substrate to remove the thin film in one of
      I. the exposed or unexposed regions so that the unremoved material in the other region form banks that define well regions of uncovered substrate;
   f. heating the developed substrate and
   g. depositing at least one active material into the well area defined by the banks of unremoved photoresist and the substrate to form at least one layer(s) of active material overlying and in contact with the substrate.

2. The method according to claim 1, wherein in step a), the concentration of cresol novolak resin in the solution is 30% by weight or less.

3. The method according to claim 1, wherein the non-ionic urethane polyglycol fluorosurfactant contains poly(ethylene glycol) groups.

4. The method according to claim 3, wherein the non-ionic urethane polyglycol fluorosurfactant contains a group derived from a perfluoroalkyl group with a terminal hydroxyl or carboxyl group.

5. The method according to claim 1, wherein the diazonaphthoquinone sulfonic ester of a polyhydroxybenzophenone compound is a 2-diazonaphtho-1-quinone substituted in either the 4- or 5-position with an sulfonic ester of a benzophenone group further substituted with 2 or 3 hydroxyl groups.

6. The method according to claim 5, wherein the diazonaphthoquinone sulfonic ester of a polyhydroxybenzophenone compound is a 4-sulfonic ester according to Formula (II):

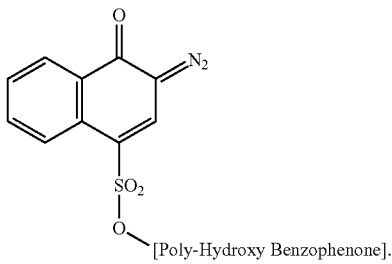

[Poly-Hydroxy Benzophenone].

7. The method according to claim 1, wherein the at least one active layer(s) are deposited as a solution of active materials using an inkjet method.

8. The method according to claim 1, wherein the substrate is transparent and where the at least one active layer(s) contain a colorant in a color filter array.

9. The method according to claim 1, wherein the substrate is electrically conductive and the at least one layer(s) of active material is in electrical contact with a second electrically conductive layer.

10. The method according to claim 1, wherein there are at least a first and second active layers where the first active layer is in contact with the substrate and is electrically conductive, and the second active layer is in electrical contact with a second electrically conductive layer.

11. The method according to claim 9, wherein at least one of the active layer(s) contains a photoactive material in an organic photovoltaic device (OPV).

12. The method according to claim 9, wherein at least one of the active layer(s) contains a material that emits light in an electroluminescent (EL) device.

13. The method according to claim 12, wherein the substrate is transparent and the second overlying electrically conductive layer is an opaque metal so that light is emitted through the substrate.

14. The method according to claim 12, wherein the substrate is opaque and the second overlying electrically conductive layer is transparent so that light is emitted from the side of the device opposite to the substrate.

15. The method according to claim 9, wherein at least one of the active layer(s) contains charged pigment particles dispersed in a liquid in an electrophoretic (EP) device.

16. The method according to claim 9, wherein at least one of the active layer(s) contains an organic semiconducting or charge-carrying material in an organic thin-film transistor (OTFT) device.

17. The method according to claim 9, wherein at least one of the active layer(s) contains a colored liquid in an electrowetting (EW) device.

18. The method according to claim 1, wherein the development of the exposed photoresist during step e) is negative working so that the unexposed region is removed and the insoluble exposed region forms the bank structures.

19. The method according to claim 1, wherein the development of the exposed photoresist during step e) is positive working so that the exposed region is removed and the insoluble unexposed region forms the bank structures.

20. The method according to claim 7, where in the solution of step a), the ratio of % weight cresol novolak resin to % weight of non-ionic urethane glycol fluorosurfactant is in the range of 2:1 to 10:1.

21. The method according to claim 20, wherein the solution of active material(s) deposited by ink-jet is aqueous.

22. The method according to claim 7, wherein the solution of active material(s) deposited by ink-jet is organic and the ratio of % weight cresol novolak resin to % weight of non-ionic urethane glycol fluorosurfactant in the solution of step a) is 2:1 to 100:1.

23. The method according to claim 22, where the ratio of % weight cresol novolak resin to % weight of non-ionic urethane glycol fluorosurfactant in the solution of step a) is 7:1 to 50:1.

24. The method according to claim 1, wherein the bank height over the substrate is in the range of 1.0 to 3 µm.

25. A pattern of bank structures on a substrate where the bank structures are derived from a photoresist formulation comprising a cresol novolak resin, a photoactive diazonaphthoquinone sulfonic ester of a polyhydroxybenzophenone compound with at least one free hydroxyl group, and a non-ionic urethane polyglycol fluorosurfactant.

26. The bank structures according to claim 25, wherein the concentration of cresol novolak resin in the photoresist formulation is 30% by weight or less.

27. The bank structures according to claim 25, wherein the non-ionic urethane polyglycol fluorosurfactant contains poly(ethylene glycol) groups.

28. The bank structures according to claim 25, wherein the non-ionic urethane polyglycol fluorosurfactant contains a group derived from a perfluoroalkyl group with a terminal hydroxyl or carboxyl group.

29. The bank structures according to claim 25, wherein the diazonaphthoquinone sulfonic ester of a polyhydroxybenzophenone compound is a 2-diazonaphtho-1-quinone substituted in either the 4- or 5-position with a sulfonic ester of a benzophenone group further substituted with 2 or 3 hydroxyl groups.

30. The bank structures according to claim 25, wherein the ratio of % weight cresol novolak resin to % weight of non-ionic urethane glycol fluorosurfactant is in the range of 2:1 to 10:1.

31. The bank structures according to claim 25, wherein the bank structures define a well region that contains at least one solid layer of active material(s).

32. The bank structures according to claim 25, wherein the bank structures define a well region that contains a liquid layer of active material(s).

33. The bank structures according to claim 25, wherein the diazonaphthoquinone sulfonic ester of a polyhydroxybenzophenone compound is a 4-sulfonic ester according to Formula (II):

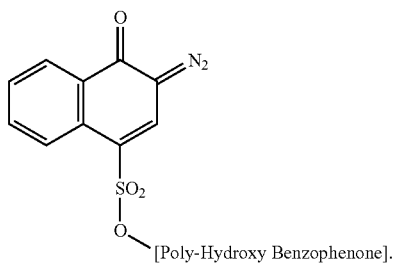

[Poly-Hydroxy Benzophenone].

* * * * *